(12) United States Patent
Sakai et al.

(10) Patent No.: US 11,096,278 B2
(45) Date of Patent: Aug. 17, 2021

(54) CERAMIC CIRCUIT BOARD

(71) Applicant: DENKA COMPANY LIMITED, Tokyo (JP)

(72) Inventors: Atsushi Sakai, Machida (JP); Hideki Hirotsuru, Machida (JP); Kohki Ichikawa, Machida (JP); Yoshitaka Taniguchi, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 0 days.

(21) Appl. No.: 16/636,239

(22) PCT Filed: Jul. 30, 2018

(86) PCT No.: PCT/JP2018/028422
§ 371 (c)(1),
(2) Date: Feb. 3, 2020

(87) PCT Pub. No.: WO2019/026834
PCT Pub. Date: Feb. 7, 2019

(65) Prior Publication Data
US 2020/0375029 A1    Nov. 26, 2020

(30) Foreign Application Priority Data
Aug. 4, 2017 (JP) .............................. JP2017-151888

(51) Int. Cl.
*H05K 1/03* (2006.01)
*H05K 1/05* (2006.01)

(52) U.S. Cl.
CPC .......... *H05K 1/0306* (2013.01); *H05K 1/053* (2013.01); *H05K 2201/068* (2013.01)

(58) Field of Classification Search
CPC .............................. H05K 1/0306; H05K 1/03
See application file for complete search history.

(56) References Cited

U.S. PATENT DOCUMENTS 6,413,620 B1 * 7/2002 Kimura ................... H05K 3/20
174/251
2008/0193777 A1    8/2008 Tuan et al.
2012/0114966 A1    5/2012 Tuan et al.

FOREIGN PATENT DOCUMENTS

| DE | 10 2005 042 554 A1 | 2/2007 |
| JP | 2000-294699 A | 10/2000 |
| JP | 2001-127157 A | 5/2001 |

(Continued)

OTHER PUBLICATIONS

Oct. 9, 2018 International Search Report issued in International Patent Application No. PCT/JP2018/028422.

(Continued)

*Primary Examiner* — Jeremy C Norris
(74) *Attorney, Agent, or Firm* — Oliff PLC (57) ABSTRACT

A ceramic circuit board includes a ceramic substrate and metal layers provided to both surfaces of the ceramic substrate and containing Al and/or Cu, wherein a measurement value $\alpha 1$ of a linear thermal expansion coefficient at 25° C. to 150° C. is $5 \times 10^{-6}$ to $9 \times 10^{-6}$/K, a ratio $\alpha 1/\alpha 2$ of the $\alpha 1$ to a theoretical value $\alpha 2$ of the linear thermal expansion coefficient at 25° C. to 150° C. is 0.7 to 0.95, and at least one of the metal layers forms a metal circuit.

11 Claims, 4 Drawing Sheets

(56) References Cited

FOREIGN PATENT DOCUMENTS

| | | |
|---|---|---|
| JP | 2002-076551 A | 3/2002 |
| JP | 2002-203942 A | 7/2002 |
| JP | 2004-207587 A | 7/2004 |
| JP | 2008-283184 A | 11/2008 |
| JP | 2015-220295 A | 12/2015 |

OTHER PUBLICATIONS

Feb. 4, 2020 International Preliminary Report on Patentability issued in International Patent Application No. PCT/JP2018/028422.
Jun. 17, 2020 Extended Search Report issued in European Patent Application No. 18841449.4.

* cited by examiner

CERAMIC CIRCUIT BOARD

TECHNICAL FIELD

The present invention relates to a ceramic circuit board, and particularly to a ceramic circuit board suitably mounted on a high-power electronic component such as a power module.

BACKGROUND ART

In recent years, along with the increase in performance of industrial devices including robots and motors, an inverter has been required to have larger current and higher efficiency. In such circumstances, in the power module used in the inverter, the heat generated from the semiconductor element has also been increasing. In order to diffuse the heat generated from the semiconductor element efficiently, a ceramic circuit board with excellent thermal conductivity has been used.

A power module generally includes a ceramic circuit board, a semiconductor element provided on one surface of the ceramic circuit board, a base plate provided on the other surface of the ceramic circuit board by soldering or the like and made of Cu, Cu—Mo, Cu—C, Al, Al—SiC, Al—C, or the like with excellent thermal conductivity, and a heat radiation fin provided to a surface of the base plate on a side opposite to the ceramic circuit board with a screw or the like.

However, since the soldering between the base plate and the ceramic circuit board is performed by heating, there has been a problem that the base plate is easily warped because of the difference in thermal expansion coefficient between the base plate and the ceramic circuit board.

The heat generated from the semiconductor element and the like in the operation of the power module is transmitted to the heat radiation fin through the ceramic circuit board, the solder, and the base plate. Therefore, if the warp is generated in the base plate, a space (air gap) is formed due to the warp when the heat radiation fin is attached to the base plate and the heat radiating property drastically deteriorates.

In order to alleviate the problem of the warp as above, for example, in a ceramic circuit board including metal layers bonded to both surfaces of a ceramic substrate, it has been suggested to use metal layers each different in hardness, kind, thickness, and the like as a metal circuit board and a heat radiation plate and to bond one metal layer to one surface of the ceramic substrate and the other metal layer to the other surface of the ceramic substrate (for example, see Patent Literature 1).

In addition, it has been suggested that when a power module is manufactured, a base plate and a ceramic circuit board are bonded together by bringing the base plate in a melted state and the ceramic circuit board in contact with each other (for example, see Patent Literature 2).

CITATION LIST

Patent Literature

Patent Literature 1: Japanese Unexamined Patent Publication No. 2004-207587
Patent Literature 2: Japanese Unexamined Patent Publication No. 2002-76551

SUMMARY OF INVENTION

Technical Problem

From the viewpoint of the reliability, it is desirable that not just the warp of the base plate can be suppressed when the ceramic circuit board is bonded to the base plate in the manufacture of the power module but also the highly close contact between the ceramic substrate and the metal layer can be maintained even after the heat generating and cooling that are repeatedly performed in the practical application. However, from the viewpoint of the reliability as described above, there is still room for improvement in the conventional ceramic circuit board and power module.

The present invention has been made in view of the above circumstance, and aims to provide a ceramic circuit board in which not just the warp of the base plate can be suppressed when the ceramic circuit board is bonded to the base plate but also the highly close contact between the ceramic substrate and the metal layer can be maintained even after the heat generating and cooling that are repeatedly performed.

Solution to Problem

The present invention provides a ceramic circuit board comprising a ceramic substrate and metal layers provided to both surfaces of the ceramic substrate and comprising Al and/or Cu, wherein a measurement value $\alpha 1$ of a linear thermal expansion coefficient at 25° C. to 150° C. is $5 \times 10^{-6}$ to $9 \times 10^{-6}$/K, a ratio $\alpha 1/\alpha 2$ of the $\alpha 1$ to a theoretical value $\alpha 2$ of the linear thermal expansion coefficient at 25° C. to 150° C. is 0.7 to 0.95, and at least one of the metal layers forms a metal circuit.

The ceramic substrate may be forming of AlN, $Si_3N_4$, or $Al_2O_3$ and the thickness may be 0.2 to 1.5 mm.

The metal layers may be formed of at least one selected from the group consisting of Cu, Al, an alloy comprising Cu and Mo, and an alloy comprising Cu and W, and the thickness may be 0.1 to 2.0 mm.

The metal layers may comprise a first metal layer and a second metal layer, and the ceramic substrate, the first metal layer, and the second metal layer may be stacked in this order. In this case, the second metal layer may comprise Cu. In addition, an end surface of the first metal layer and an end surface of the second metal layer may be flush with each other or the end surface of the first metal layer may protrude more to outside than the end surface of the second metal layer.

Advantageous Effects of Invention

The present invention can provide a ceramic circuit board in which not just the warp of the base plate can be suppressed when the ceramic circuit board is bonded to the base plate but also the highly close contact between the ceramic substrate and the metal layer can be maintained even after the heat generating and cooling that are repeatedly performed.

DESCRIPTION OF EMBODIMENTS

Some embodiments of the present invention are hereinafter described in detail. However, the present invention is not limited to the following embodiments.

Figure 1:
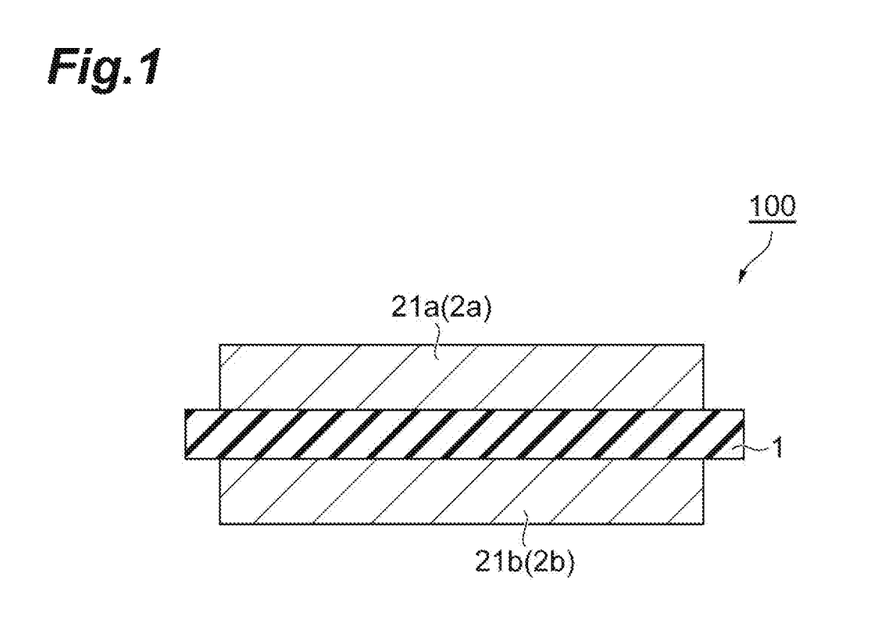
FIG. 1 is a cross-sectional view illustrating one embodiment of a ceramic circuit board.

FIG. 1 is a cross-sectional view illustrating one embodiment of a ceramic circuit board. As illustrated in FIG. 1, a ceramic circuit board 100 includes a ceramic substrate 1 and metal layers 2a and 2b provided to both surfaces of the ceramic substrate 1. At least one of the metal layers 2a and 2b forms an electric circuit (metal circuit). As illustrated in FIG. 1, the metal layer 2a may consist of single metal layer 21a and the metal layer 2b may consist of single metal layer 21b.

The metal layers 2a and 2b include Al and/or Cu, and it is preferable that Al and/or Cu is contained as a main component. Here "main component" means the component that is contained by 70 mass % or more on the basis of the entire mass of the metal layers 2a and 2b. In a case where the metal layer contains both Al and Cu, the total amount thereof may be 70 mass % or more. The ratio of the main component may be 90 mass % or more, or 95 mass % or more. The metal layer may contain a small amount of inevitable impurities.

In the ceramic circuit board according to the present embodiment, a measurement value $\alpha 1$ of the linear thermal expansion coefficient at 25° C. to 150° C. is $5 \times 10^{-6}$ to $9 \times 10^{-6}$/K, and the ratio $\alpha 1/\alpha 2$ of $\alpha 1$ to a theoretical value $\alpha 2$ of the linear thermal expansion coefficient at 25° C. to 150° C. is 0.7 to 0.95.

The present inventors consider the reason why not just the warp of the base plate can be suppressed when the ceramic circuit board with such a characteristic is bonded to the base plate but also the highly close contact between the ceramic substrate and the metal layer can be maintained even after the heat generating and cooling that are repeatedly performed (heat cycle) as follows.

First, the examination of the present inventors has clarified that the generation of the warp of the base plate in the manufacture of the power module, the separation of the ceramic substrate and the metal layer due to the heat cycle, and the generation of a crack in the ceramic substrate due to the heat cycle are caused by the difference in linear thermal expansion coefficient between the ceramic substrate and the metal layers included in the ceramic circuit board. In general, the linear thermal expansion coefficient of the metal layer is higher than that of the ceramic substrate. Therefore, the tensile stress remains in the metal layer by the heat cycle or in the case where the temperature is returned from the temperature at which the ceramic substrate and the metal layer are boned together to the room temperature. It is considered that, by the remaining of this tensile stress (residual stress), the aforementioned trouble occurs.

The present inventors have focused on the linear thermal expansion coefficient of the ceramic circuit board in order to reduce the residual stress. Further examination of the present inventors has clarified that the linear thermal expansion coefficient of the ceramic circuit board is determined based on, in addition to the composition and the structure (thickness and the like) of the ceramic substrate and the metal layer, the residual stress that is generated due to the difference in thermal expansion between the ceramic substrate and the metal layer when the temperature is returned to the room temperature from the temperature at which the both are bonded together. Therefore, even if the ceramic circuit board has the same structure, for example, the linear thermal expansion coefficient of the ceramic circuit board may be different depending on the bonding method. In general, the ceramic substrate and the metal layer are often bonded by brazing in accordance with an active metal brazing method at about 800° C. In the case of bonding by this method, after the bonding, the residual stress remains in the metal layer with the high linear thermal expansion coefficient in the process of cooling down to the room temperature. If the tensile stress remains, it is considered that the measurement value of the linear thermal expansion coefficient of the obtained ceramic circuit board becomes smaller than the theoretical value of the linear thermal expansion coefficient that is calculated based on the composition and the structure (thickness and the like) of the ceramic substrate and the metal layer. The present inventors have considered that, in the ceramic circuit board according to the present invention, the residual stress in the ceramic circuit board can be reduced by increasing the measurement value of the linear thermal expansion coefficient of the ceramic circuit board to be obtained to make the measurement value close to the theoretical value.

In addition, it is considered that, in the ceramic circuit board according to the present invention, its own residual stress can be reduced and therefore, the warp of the base plate when the ceramic circuit board is bonded to the base plate can also be suppressed regardless of the kind of the base plate or the value of the linear thermal expansion coefficient.

As a technique of increasing the measurement value of the linear thermal expansion coefficient of the ceramic circuit board, for example, it is considered effective to increase the thickness of the metal layer with the high linear thermal expansion coefficient. However, making the linear thermal expansion coefficient of the ceramic circuit board too high results in the increase in tensile stress of the metal layer against the ceramic substrate, and thus, in the heat cycle test for the practical application, a problem may occur, for example, a crack may be generated in the ceramic substrate. From such a viewpoint, the measurement value $\alpha 1$ of the linear thermal expansion coefficient of the ceramic circuit board at 25° C. to 150° C. is necessarily $5 \times 10^{-6}$ to $9 \times 10^{-6}$/K, preferably $6 \times 10^{-6}$ to $9 \times 10^{-6}$/K, and more preferably $7 \times 10^{-6}$ to $9 \times 10^{-6}$/K.

On the other hand, as a technique of making the measurement value of the linear thermal expansion coefficient of the ceramic circuit board close to the theoretical value, for example, a method of decreasing the temperature when the ceramic substrate and the metal layer are bonded together to reduce the residual stress in the metal layer or the like is considered effective. The method of bonding the ceramic substrate and the metal layer together is not limited to a particular method, and, for example, an attaching method of attaching the both with an adhesive, the active metal brazing method, a spray method, or the like may be used alone or a plurality of methods may be used in combination. From the viewpoint of decreasing the temperature at the bonding, it is preferable to employ the attaching method, the spray method, or the like. From the viewpoint of sufficiently securing the heat radiating property as the power module without using the adhesive with the low thermal conductivity, it is preferable to employ the active metal brazing method, the spray method, or the like. From such a viewpoint, a technique of forming a thin metal layer on the surface of the ceramic substrate by the active metal brazing method or the like and then bonding the metal with predetermined thickness at low temperatures or a technique of forming the metal layer by the spray method is effective. The method of bonding the ceramic substrate and the metal layer together is described in detail below.

It is necessary that the ratio $\alpha 1/\alpha 2$ of $\alpha 1$ to the theoretical value $\alpha 2$ of the linear thermal expansion coefficient of the ceramic circuit board at 25° C. to 150° C. is 0.7 to 0.95 and from the viewpoint of further reducing the residual stress in the metal layer, the ratio α1/α2 is preferably 0.75 to 0.95, and more preferably 0.80 to 0.95.

The measurement value α1 of the linear thermal expansion coefficient of the ceramic circuit board means the value measured in accordance with JIS R 1618. The measurement value α1 can be measured using, for example, the thermal dilatometer (manufactured by Seiko Instruments Inc., product name "TMA300").

In addition, the theoretical value α2 of the linear thermal expansion coefficient means the value calculated in accordance with a compound rule, and more specifically can be calculated from the following expression:

$$\alpha 2 = \Sigma \alpha_i \cdot E_i \cdot V_i / \Sigma E_i \cdot V_i$$

In the expression, α represents the thermal expansion coefficient, E represents the Young's modulus, V represents the volume fraction, and the subscript i represents each material component in the complex.

In order to obtain the ceramic circuit board 100 as above, for example, it is preferable that the ceramic substrate 1 is made of AlN, $Si_3N_4$, or $Al_2O_3$. By forming the ceramic substrate 1 with the above material, the ceramic circuit board 100 with the proper insulating property and thermal conductivity can be obtained effectively. The thickness of the ceramic substrate 1 is preferably 0.2 to 1.5 mm, more preferably 0.25 to 1.0 mm. When the thickness of the ceramic substrate 1 is less than 0.2 mm, the thermal shock resistance tends to decrease and when the thickness of the ceramic substrate 1 is more than 1.5 mm, the heat radiating property tends to decrease.

In addition, it is preferable that the metal layers 2a and 2b are made of at least one selected from the group consisting of Cu, Al, an alloy containing Cu and Mo, and an alloy containing Cu and W. By forming the metal layers 2a and 2b with the above material, the ceramic circuit board 100 with the proper insulating property and thermal conductivity can be obtained effectively. Although the metal layers 2a and 2b may be made of the same kind of material or different materials, it is preferable, from the viewpoint of facilitating the manufacture of the ceramic circuit board, that the metal layers 2a and 2b are made of the same kind of material.

The thickness of the metal layers 2a and 2b is preferably 0.1 to 2.0 mm, more preferably 0.2 to 1.0 mm. When the thickness of the metal layers 2a and 2b is less than 0.1 mm, the current that can be supplied is restricted and when the thickness of the metal layers 2a and 2b is more than 2.0 mm, the thermal shock resistance tends to decrease. Although the thickness of the metal layers 2a and 2b may be either substantially the same or different, it is preferable, from the viewpoint of facilitating the manufacture of the ceramic circuit board, that the thickness is substantially the same.

The ceramic circuit board 100 can be obtained by bonding the ceramic substrate 1 and the metal layers 2a and 2b as described above. As the method of bonding the ceramic substrate and the metal layer, for example, the attaching method of attaching the both with an adhesive, the active metal brazing method, the spray method, or the like may be used alone or a plurality of methods may be used in combination.

The attaching method is a method of attaching the both with all adhesive, and corresponds to, for example, a method in which after metal plates are attached to both surfaces of the ceramic substrate with an acrylic adhesive, an etching method is performed as desired to form a circuit.

The active metal brazing method is, for example, a method in which, in the case of boding the metal layer containing Cu, Cu plates are bonded to both surfaces of the ceramic substrate at 800° C. using the brazing material of Ag (90%)-Cu (10%)-$TiH_2$ (3.5%) and then the etching method is performed as desired to form a circuit. In addition, in the case of bonding the metal layer containing Al, for example, a method in which Al plates are bonded to both surfaces of the ceramic substrate at 630° C. using an Al—Cu—Mg clad foil as the brazing material, and then the etching method is performed as desired to form a circuit is given.

The spray method (cold spray method) includes, for example, a step of forming the metal layer on the ceramic substrate by spraying the metal powder made of a plurality of metal particles after heating the metal powder at 10 to 270° C. and accelerating the metal powder at a speed of 250 to 1050 m/s, and a step of heating the ceramic substrate and the metal layer formed on the ceramic substrate in the inert gas atmosphere. By using Al and/or Cu particles as the metal particles of the metal powder, the metal layer containing these is formed.

In the aforementioned embodiment, the metal layer 2a consists of the single metal layer 21a and the metal layer 2b consists of the single metal layer 21b, but the present invention is not limited to the above embodiment and each of the metal layers 2a and 2b may include two or more metal layers.

Figure 2:
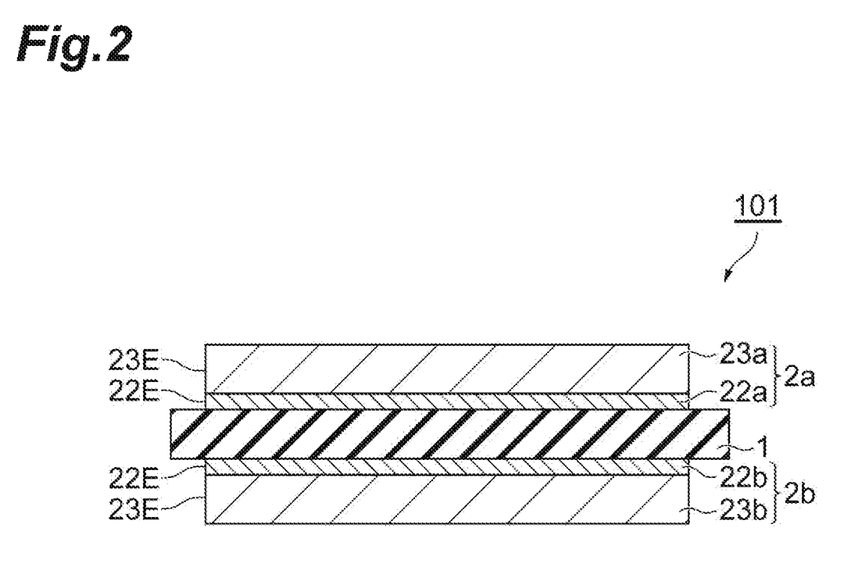
FIG. 2 is a cross-sectional view illustrating one embodiment of the ceramic circuit board.
Figure 3:
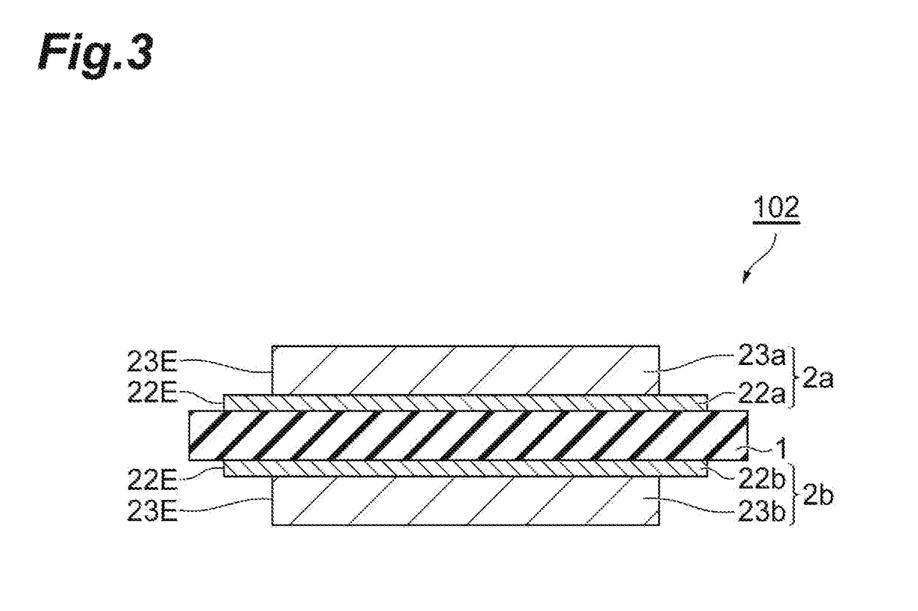
FIG. 3 is a cross-sectional view illustrating one embodiment of the ceramic circuit board.

FIG. 2 and FIG. 3 are cross-sectional views each illustrating another embodiment of the ceramic circuit board. In a ceramic circuit board 101 in FIG. 2 and a ceramic circuit board 102 in FIG. 3, the metal layers 2a and 2b respectively include first metal layers 22a and 22b on and in contact with the ceramic substrate 1, and second metal layers 23a and 23b formed on the first metal layers 22a and 22b. The first metal layers 22a and 22b and the second metal layers 23a and 23b can be respectively made of the material similar to that of the metal layers 2a and 2b described above, and it is particularly preferable that the first metal layers 22a and 22b are made of Al or an alloy containing Al, and the second metal layers 23a and 23b are made of Cu or an alloy containing Cu. By forming the first metal layers 22a and 22b with the soft material such as Al or an alloy containing Al, the ceramic circuit board with excellent shock resistance can be obtained. By forming the second metal layers 23a and 23b with Cu or an alloy containing Cu, the ceramic circuit board with excellent thermal conductivity that can deal with large current can be obtained effectively. Note that in the ceramic circuit board 101 illustrated in FIG. 2, an end surface 22E of the first metal layers 22a and 22b and an end surface 23E of the second metal layers 23a and 23b are flush with each other. However, in order for the ceramic circuit board to have higher thermal shock resistance, the end surface 22E of the first metal layers 22a and 22b may exist on the outside of the end surface 23E of the second metal layers 23a and 23b, that is, protrude to the end part side of the ceramic substrate 1 like in the ceramic circuit board 102 illustrated in FIG. 3. The width of the part where the end surface 22E protrudes from the end surface 23E may be, for example, 1 to 1000 μm.

The ceramic circuit board described above is suitably used in the power module, and not just the warp of the base plate that is caused when the ceramic circuit board is bonded to the base plate can be suppressed but also the highly close contact between the ceramic substrate and the metal layer can be maintained even after the heat generating and cooling that are repeatedly performed.

The warp of the base plate that is caused when the ceramic circuit board is bonded to the base plate is measured as the deformation amount (warp change amount) from the initial shape (initial warp amount) of the base plate itself when the ceramic circuit board is bonded to the base plate. In addition, the warp amount of the base plate means the size of the warp per a length of 10 cm in the radiation surface direction at an arbitrary position on the base plate. The warp change amount of the base plate is preferably 20 μm or less, more preferably 15 μm or less, and much more preferably 10 μm or less as the warp change amount of the base plate to be bonded to the ceramic circuit board. The warp change amount is defined as the absolute value of the difference between the warp amount of the base plate before the base plate is bonded to the ceramic circuit board and the warp amount of the base plate after the base plate is bonded to the ceramic circuit board.

Figure 4:
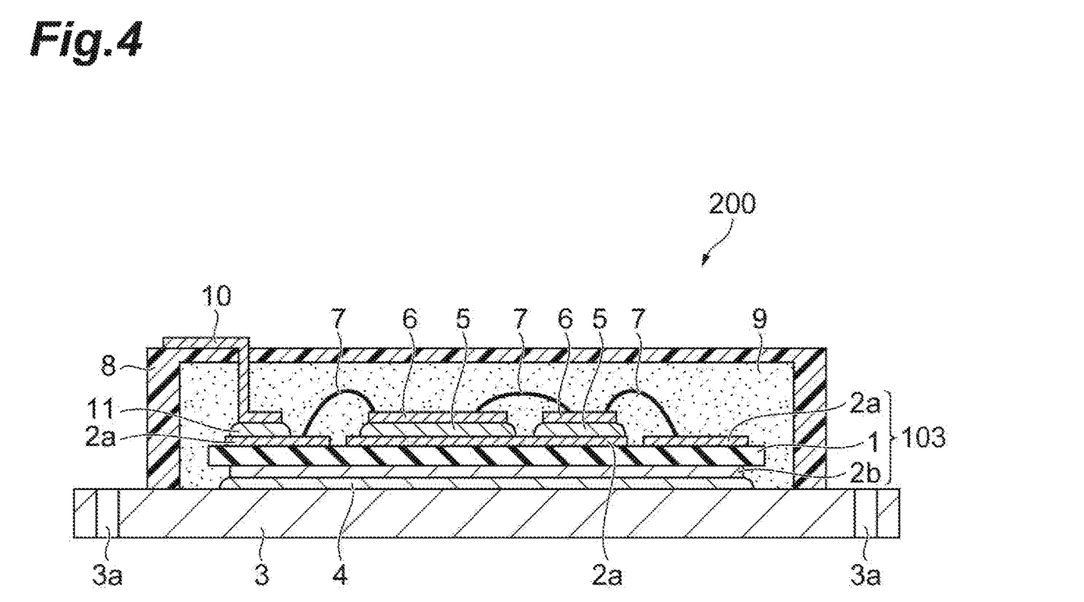
FIG. 4 is a cross-sectional view illustrating one embodiment of a power module.

FIG. 4 is a cross-sectional view illustrating one embodiment of the power module. As illustrated in FIG. 4, a power module 200 includes a base plate 3, a ceramic circuit board 103 bonded on the base plate 3 through a first solder 4, and a semiconductor element 6 that is bonded on the ceramic circuit board 103 through a second solder 5.

The ceramic circuit board 103 includes the ceramic substrate 1 and the metal layers 2a and 2b provided to both surfaces of the ceramic substrate 1. The base plate 3 is bonded to the metal layer 2b through the first solder 4. The semiconductor element 6 is bonded to a predetermined part of the metal layer 2a through the second solder 5, and also bonded to a predetermined part of the metal layer 2a with a metal wire 7 such as an aluminum wire (aluminum line). Note that in the power module illustrated in FIG. 4, the metal layer 2a forms an electric circuit (metal circuit). The metal layer 2b may or may not form the metal circuit.

The components provided on the base plate 3 is covered with a housing 8 made of resin and having a hollow box shape with one surface open, for example, and are contained in the housing 8. The hollow part between the base plate 3 and the housing 8 is filled with a filling material 9 such as silicone gel. To a predetermined part of the metal layer 2a, an electrode 10 penetrating the housing 8 is bonded through a third solder 11 so that electric connection to the outside of the housing 8 is possible.

At an edge part of the base plate 2, attachment holes 3a for screwing used for attaching, for example, a heat radiation component to the power module 200 are formed. The number of attachment holes 3a is four or more, for example. At the edge part of the base plate 3, an attachment groove may be formed instead of the attachment holes 3a. The attachment groove is formed in such a way that a side wall of the base plate 3 has a U-like cross-sectional shape.

Since the power module 200 includes the ceramic circuit board according to the present embodiment described above, the power module 200 is suitably used as the driving inverter for a train or an automobile that is required to have higher withstanding voltage and higher output, for example.

EXAMPLES

Hereinafter, the present invention is described in more detail with reference to Examples. However, the present invention is not limited to these Examples.

Example 1

As the ceramic substrate, an aluminum nitride (AlN) substrate (size: 50 mm×60 mm×0.635 mmt) was used. An Al—Cu—Mg clad foil was used as the brazing material, Al plates (thickness 0.2 mm) were bonded to both surfaces of the ceramic substrate at 630° C., and etching was performed to form an Al circuit. Subsequently, a Cu circuit with a thickness of 0.4 mm was stacked by a spray method (cold spray method) and an annealing process was performed at 300° C., and then electroless Ni plating was performed to produce a ceramic circuit board.

Example 2

An Al circuit with a thickness of 0.2 mm was stacked by the spray method (cold spray method) on each surface of a ceramic substrate similar to that of Example 1 and the annealing process was performed at 500° C. Subsequently, a Cu circuit with a thickness of 0.4 mm was stacked by the spray method (cold spray method) and the annealing process was performed at 300° C., and then electroless Ni plating was performed to produce a ceramic circuit board.

Example 3

As the ceramic substrate, a silicon nitride ($Si_3N_4$) substrate (size: 50 mm×60 mm×0.32 mint) was used. An Ag—Cu—$TiH_2$ brazing material was used, Cu plates (thickness 0.1 mm) were bonded to both surfaces of the ceramic substrate at 800° C., and then the Cu plate (thickness 0.9 mm) was bonded with a temperature-decreasing solder with a melting point of 300° C. After the Cu circuit was formed by etching, the electroless Ni plating was performed and a ceramic circuit board was manufactured.

Example 4

An Al circuit with a thickness of 0.4 mm was formed by the spray method (cold spray method) on both surfaces of a ceramic substrate similar to that of Example 1, the annealing process was performed at 500° C., and then electroless Ni plating was performed to produce a ceramic circuit board.

Example 5

After Cu metal with a thickness of 0.3 mm was attached to both surfaces of a ceramic substrate similar to that of Example 1 with an acrylic adhesive, a Cu circuit was formed by etching and then electroless Ni plating was performed to produce a ceramic circuit board.

Comparative Example 1

An Ag—Cu—$TiH_2$ brazing material was used, Cu plates (thickness 0.3 mm) were bonded to both surfaces of the ceramic substrate similar to that of Example 1 at 800° C., and then the etching was performed to form the Cu circuit and after that the electroless Ni plating was performed to produce a ceramic circuit board.

Comparative Example 2

A ceramic circuit board was manufactured by performing the operation similar to that of Comparative example 1 except that an aluminum nitride (AlN) substrate (size: 50 mm×60 mm×1.0 mmt) was used as the ceramic substrate.

Comparative Example 3

A ceramic circuit board was manufactured by performing the operation similar to that of Comparative example 1 except that a silicon nitride ($Si_3N_4$) substrate (size: 50 mm×60 mm×0.635 mmt) was used as the ceramic substrate.

Comparative Example 4

A ceramic circuit board was manufactured by performing the operation similar to that of Comparative example 1 except that a silicon nitride ($Si_3N_4$) substrate (size: 50 mm×60 mm×0.32 mmt) was used as the ceramic substrate.

Comparative Example 5

A ceramic circuit board was manufactured by performing the operation similar to that of Comparative example 4 except that a Cu plate (thickness 1.0 mm) was used.

Comparative Example 6

An Al—Cu—Mg clad foil was used as the brazing material, Al plates (thickness 0.4 mm) were bonded to both surfaces of a ceramic substrate similar to that of Example 1 at 630° C., and then the etching was performed to form the Al circuit and after that, the electroless Ni plating was performed to produce a ceramic circuit board.

Table 1 shows the details of the ceramic circuit boards according to Examples and Comparative examples.

In the expression, α represents the thermal expansion coefficient, E represents the Young's modulus, V represents the volume fraction, and the subscript i represents each material component in the complex.

Note that the thermal expansion coefficient and the Young's modulus of each material component in the complex were calculated using the values shown in the following Table 2.

TABLE 2

| Material | Thermal expansion coefficient (×10⁻⁶/K) | Young's modulus (GPa) |
|---|---|---|
| AlN | 4.3 | 320 |
| $Si_3N_4$ | 2.6 | 300 |
| $Al_2O_3$ | 7.1 | 330 |
| Al | 23.1 | 70 |
| Cu | 16.5 | 120 |

TABLE 1

| | Ceramic substrate 1 | | Metal layers 21a, 21b (22a, 22b) | | Metal layers 23a, 23b | | Bonding | |
|---|---|---|---|---|---|---|---|---|
| | Material | Thickness (mm) | Material | Thickness (mm) | Material | Thickness (mm) | Bonding technique (circuit formation) | temperature (° C.) |
| Example 1 | AlN | 0.635 | Al | 0.2 | Cu | 0.4 | Active metal brazing method/ spray method | 630° C./300° C. |
| Example 2 | AlN | 0.635 | Al | 0.2 | Cu | 0.4 | Spray method/ spray method | 500° C./300° C. |
| Example 3 | $Si_3N_4$ | 0.32 | Cu | 0.1 | Cu | 0.9 | Active metal brazing method/ soldering | 800° C./300° C. |
| Example 4 | AlN | 0.635 | Al | 0.4 | — | — | Spray method | 300° C. |
| Example 5 | AlN | 0.635 | Cu | 0.3 | — | — | Attaching method | 25° C. |
| Comparative example 1 | AlN | 0.635 | Cu | 0.3 | — | — | Active metal brazing method | 800° C. |
| Comparative example 2 | AlN | 1.0 | Cu | 0.3 | — | — | Active metal brazing method | 800° C. |
| Comparative example 3 | $Si_3N_4$ | 0.635 | Cu | 0.3 | — | — | Active metal brazing method | 800° C. |
| Comparative example 4 | $Si_3N_4$ | 0.32 | Cu | 0.3 | — | — | Active metal brazing method | 800° C. |
| Comparative example 5 | $Si_3N_4$ | 0.32 | Cu | 1.0 | — | — | Active metal brazing method | 800° C. |
| Comparative example 6 | AlN | 0.635 | Al | 0.4 | — | — | Active metal brazing method | 630° C. |

<Measurement of Linear Thermal Expansion Coefficient of Ceramic Circuit Board (Measurement of α1)>

The obtained ceramic circuit board was cut into a size of 4 mm×20 mm, and thus, a measurement test piece for the linear thermal expansion coefficient was manufactured. The temperature of the obtained test piece was decreased at 5° C./min using the thermal dilatometer (manufactured by Seiko Instruments Inc., product name "TMA300") and thus, the linear thermal expansion coefficient from 25° C. to 150° C. was measured.

<Calculation of Theoretical Value of Linear Thermal Expansion Coefficient of Ceramic Circuit Board (Calculation of α2)>

The theoretical value of the linear thermal expansion coefficient was calculated using the following expression:

$$\alpha 2 = \Sigma \alpha_i \cdot E_i \cdot V_i / \Sigma E_i \cdot V_i$$

<Measurement of warp change amount of base plate after solder bonding>

After an Al—SiC (65%) material was processed into a size of 140×190×5 mm, electroless Ni plating was performed to obtain the base plate. This base plate and the ceramic circuit board obtained in Examples and Comparative examples were bonded together with eutectic solder to obtain a measurement sample.

The shape of the heat radiation surface of the base plate in the measurement sample was measured using a three-dimensional contour profile measuring machine (manufactured by TOKYO SEIMITSU CO. LTD., product name "CONTOURECORD 1600D-22"). Thus, the warp change amount of the base plate per a length of 10 cm was measured.

The results of evaluating the ceramic circuit boards are collectively shown in Table 3.

TABLE 3

| | Linear thermal expansion coefficient | | | Warp change amount (μm) |
|---|---|---|---|---|
| | Measurement value (×10⁻⁶/K) | Theoretical value (×10⁻⁶/K) | Measurement value/ theoretical value | |
| Example 1 | 6.7 | 9.5 | 0.71 | 1 |
| Example 2 | 6.9 | 9.5 | 0.73 | 1 |
| Example 3 | 9.0 | 12.5 | 0.72 | 3 |
| Example 4 | 6.0 | 8.4 | 0.71 | 5 |
| Example 5 | 6.8 | 7.5 | 0.91 | 5 |
| Comparative example 1 | 5.1 | 7.5 | 0.68 | 35 |
| Comparative example 2 | 4.8 | 6.5 | 0.73 | 37 |
| Comparative example 3 | 3.4 | 6.4 | 0.53 | 50 |
| Comparative example 4 | 4.5 | 8.6 | 0.53 | 40 |
| Comparative example 5 | 6.9 | 12.5 | 0.55 | 22 |
| Comparative example 6 | 5.1 | 8.4 | 0.61 | 35 |

For the samples according to Examples 1 to 5, 1000 cycles of the heat cycle test were performed, one cycle consisting of leaving the sample in an environment of 125° C. for 30 minutes and then leaving the sample in an environment of −40° C. for 30 minutes. After the heat cycle test, the abnormality such as separation of the metal circuit was not observed in the ceramic circuit boards according to Examples 1 to 5, and it has been indicated that the highly close contact is maintained.

REFERENCE SIGNS LIST

1 Ceramic substrate
2*a*, 2*b* Metal layer
21*a*, 21*b* Single metal layer
22*a*, 22*b* First metal layer
22E End surface of first metal layer
23*a*, 23*b* Second metal layer
23E End surface of second metal layer
100, 101, 102, 103 Ceramic circuit board

The invention claimed is:

1. A ceramic circuit board comprising:
  a ceramic substrate that has only one layer; and
  metal layers provided on both surfaces of the ceramic substrate and comprising Al and/or Cu, wherein
  a measurement value $\alpha 1$ of a linear thermal expansion coefficient at 25° C. to 150° C. is in a range of from $5 \times 10^{-6}$ to $9 \times 10^{-6}$/K,
  a ratio $\alpha 1/\alpha 2$ of the $\alpha 1$ to a theoretical value $\alpha 2$ of the linear thermal expansion coefficient at 25° C. to 150° C. is in a range of from 0.7 to 0.95, and
  at least one of the metal layers forms a metal circuit.

2. The ceramic circuit board according to claim 1, wherein the ceramic substrate consists of AlN, $Si_3N_4$, or $Al_2O_3$.

3. The ceramic circuit board according to claim 1, wherein a thickness of the ceramic substrate is 0.2 to 1.5 mm.

4. The ceramic circuit board according to claim 1, wherein the metal layers are formed of at least one selected from the group consisting of Cu, Al, an alloy comprising Cu and Mo, and an alloy comprising Cu and W.

5. The ceramic circuit board according to claim 1, wherein a thickness of the metal layers is 0.1 to 2.0 mm.

6. The ceramic circuit board according to claim 1, wherein the metal layers comprise a first metal layer and a second metal layer, and the ceramic substrate, the first metal layer, and the second metal layer are stacked in this order.

7. The ceramic circuit board according to claim 6, wherein the second metal layer comprises Cu.

8. The ceramic circuit board according to claim 6, wherein an end surface of the first metal layer and an end surface of the second metal layer are flush with each other or the end surface of the first metal layer protrudes more to outside than the end surface of the second metal layer.

9. The ceramic circuit board according to claim 1, wherein one of the metal layers does not form a metal circuit.

10. The ceramic circuit board according to claim 1, wherein the ceramic circuit board has the measurement value $\alpha 1$ in a range of from $6 \times 10^{-6}$ to $9 \times 10^{-6}$/K.

11. The ceramic circuit board according to claim 1, wherein the ceramic circuit board has the ratio $\alpha 1/\alpha 2$ in a range of from 0.71 to 0.95.

* * * * *